United States Patent

[11] 3,631,359

[72] Inventor Raymond A. Jones
Swampscott, Mass.
[21] Appl. No. 34,935
[22] Filed May 6, 1970
[45] Patented Dec. 28, 1971
[73] Assignee TRW Inc.
Cleveland, Ohio

[54] MULTIVIBRATOR DRIVEN REGENERATIVE TRANSISTOR DRIVE CIRCUIT FOR LAMP FLASHER
3 Claims, 1 Drawing Fig.

[52] U.S. Cl. .................... 331/75, 315/200 A, 331/113 R, 340/81 R
[51] Int. Cl. .................... H03b 3/282, H05b 39/09
[50] Field of Search .................... 331/75; 113 R; 315/135, 136, 200 A; 340/81 R

[56] References Cited
UNITED STATES PATENTS

| | | | |
|---|---|---|---|
| 3,461,399 | 8/1969 | Houpis et al. | 331/75 X |
| 3,253,596 | 5/1966 | Keller, Jr. | 331/113 X |
| 3,253,186 | 5/1966 | Rogers et al. | 315/200.1 A |
| 3,483,479 | 12/1969 | Harshbarger | 331/113 X |
| 3,541,398 | 11/1970 | Simister | 331/113 X |

*Primary Examiner*—John Kominski
*Assistant Examiner*—Siegfried H. Grimm
*Attorneys*—Philip E. Parker, Gordon Needleman, James R. O'Connor, John Todd and Hall & Houghton

ABSTRACT: This is a solid-state lamp flasher operated from an oscillator using the combination of NPN-transistor and a PNP-transistor to drive the load and create regenerative action and another NPN-transistor to stop the regenerative action when it receives a signal from the oscillator.

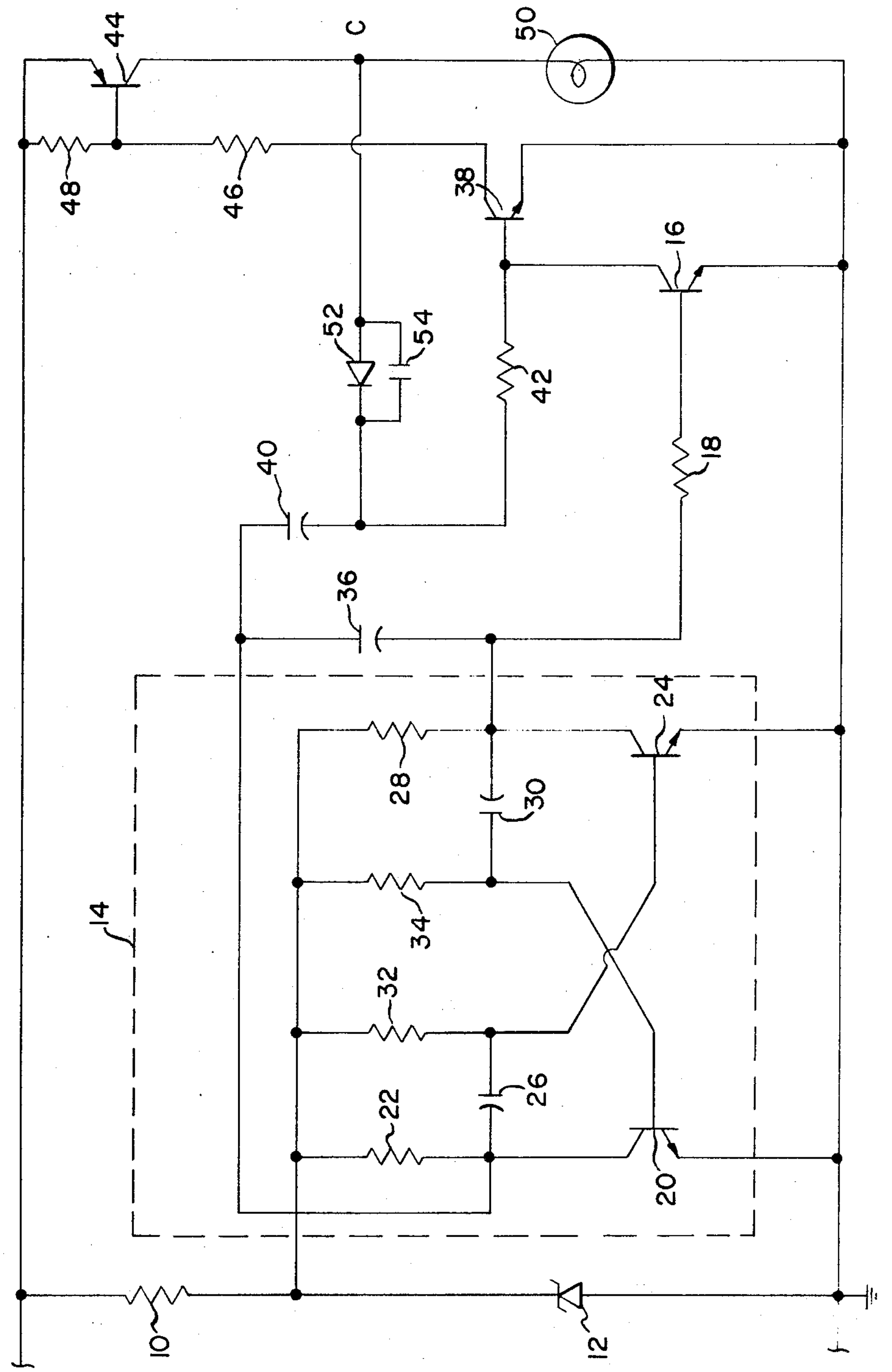
INVENTOR
RAYMOND A. JONES
BY
Gordon Needleman
ATTORNEY

MULTIVIBRATOR DRIVEN REGENERATIVE TRANSISTOR DRIVE CIRCUIT FOR LAMP FLASHER

SUMMARY OF THE INVENTION

An object of the present invention is to provide a solid-state flasher circuit.

A further object is to provide a solid-state flasher circuit using NPN- and PNP-transistors to provide the on sequence of the flasher from an oscillator signal and to provide regenerative action to preserve the on condition.

A still further object of the present invention is to provide a solid-state flasher using a transistor to transmit a signal from an oscillator thereby turning the flashing sequence on.

A still further object of the present invention is to provide a diode in series with the base of the NPN-transistor and with a collector of a PNP-transistor to protect the circuit against damage due to a short circuit at the load.

BRIEF DESCRIPTION OF THE DRAWING

The FIGURE is a circuit diagram of the solid-state flasher.

DESCRIPTION OF THE PREFERRED EMBODIMENT

Referring to the drawing, there is shown a regenerative switch which may be powered by a DC power supply such as a 12-volt automobile battery. The battery could be connected to a resistor 10 in series with a zener diode 12. The zener diode 12 is connected to ground and with the resistor 10 acts as a stabilizing circuit for the voltage applied to the astable or free running multivibrator system 14. The stabilizing circuit provides a constant toggle rate for the multivibrator over the voltage range of the power supply. The multivibrator system 14 is coupled to a signal transistor 16 through a current limiting resistor 18.

The astable multivibrator system 14 comprises a first multivibrator transistor 20 having its emitter at ground and having a collector reversed biased by the load transistor 22. The collector of the first multivibrator transistor 20 is connected to the base of the second multivibrator transistor 24 through the first coupling capacitor 26. The emitter of the second multivibrator transistor 24 is at ground potential and its collector is biased by the series load resistor 28 and is connected to the base of the first multivibrator 20 through the second coupling capacitor 30. As is well known in the art the length of time which each stage of the multivibrator conducts depends on how long the other stage is cut off. This, in turn, depends on the RC time constant of the first coupling capacitor 26 and the bias resistor 32 and the second coupling capacitor 30 and its bias resistor 34. Since no two transistors are exactly the same, assume that the first multivibrator transistor 20 starts conducting first, its collector voltage will lower faster than that of the second multivibrator transistor 24 causing a decrease in the conduction of the second multivibrator transistor 24 with a corresponding increase in its collector voltage. This rise in the collector voltage is coupled back to the base of the first multivibrator transistor 20 driving it to saturation while the second multivibrator transistor is being driven to cutoff. Once the respective saturation and cutoff have been reached this condition will continue until the first coupling capacitor 26 discharges sufficiently to allow the base of the second multivibrator transistor 24 to rise above cutoff. At this time the second multivibrator transistor 24 begins conducting and starts the second half of the switching cycle. Since the flasher is designed for vehicular environment the device must have a high degree of electrical noise immunity. This immunity is derived from the zener diode 12 and the capacitor 36 which protect the multivibrator system 14 from large negative noise pulses. The capacitor 36 is placed in shunt across the multivibrator system 14 as shown in FIG. 1.

Capacitor 36 is used to protect the multivibrator system from large negative noise pulses. The capacitor 36 will shunt the pulse to ground through the then-on transistor. Furthermore, since both transistor collectors of the multivibrator system are connected by the capacitor 36, any noise regeneration will be effectively decoupled by it.

The collector of the first multivibrator transistor 20 is connected to the drive transistor 38 through the turn-on capacitor 40 and the current limiting resistor 42. The emitter of the drive transistor 38 is at ground potential while the collector is connected to the base of the PNP-transistor 44 through the resistor 46. An emitter bypass resistor 48 is connected between the emitter and the base of the PNP-transistor 44 to reduce leakage currents. The collector of the PNP-transistor 44 is connected to the load 50 which in this case is an incandescent bulb. The collector is also connected through the junction C with the base of the drive transistor 38. This latter connection is made through a feedback diode 52 and the current limiting resistor 42. The feedback diode 52 has a shunt capacitor 54 in parallel with it.

The flasher works in the following manner. Assuming that the first multivibrator transistor 20 has just turned on, this charges the turn-on capacitor 40 which delivers an initial current flow, through the current limiting resistor 42 and the base emitter junction of the transistor 38 turning it on. The drive transistor 38 lowers the voltage at the base of the PNP-transistor 44 with respect to its emitter causing it to turn on which in turn causes the lamp load 50 to glow. Simultaneously and instantly the current from the PNP-transistor 44 is passed around the feedback diode 52 through the shunt capacitor 54 and the current limiting resistor 42 to the base of the drive transistor 38 starting a regenerative current. At some predetermined voltage at the junction C the feedback diode 52 will conduct. When the first multivibrator transistor 20 goes to cutoff the second multivibrator transistor 24 will deliver current to the base of the transistor 16 through the current limiting resistor 18 turning it on. Current through the current limiting resistor 42 is now diverted through the collector of the transistor 16 to ground dropping the voltage at the base of the drive transistor 38 and thereby turning it off stopping the regenerative action and causing the bulb load 50 to go off. This off condition will continue until the next pulse from the multivibrator system starts the process again.

The voltage at which the feedback diode 52 turns on can be changed by adding more diodes in series with it or by utilizing zener-type diodes in its place. If this should be necessary or desirable, the shunt capacitor 54 would be placed in parallel with all of the feedback diodes. As the shunt capacitor 54 is used to cover more than one feedback diode, its value will probably have to be changed.

If a short circuit appears across the load 50, the voltage at point C will not rise, or if it is already high, it will abruptly fall toward zero. The feedback diode 52 will no longer conduct because its forward voltage drop will not be exceeded and the drive transistor 38 also will not have base emitter forward breakdown exceeded. Unless the voltage at C rises above the sum of these two voltages the circuit will shut off. Each time the multivibrator system completes a cycle, an initial pulse will pass along through the coupling capacitor and current limiting resistor to the drive transistor 38 thus attempting to turn it on. However, as long as a short circuit exists across the load, only a spike will appear and the drive transistor 38 will immediately turn off.

With reference to the foregoing description it is to be understood that what has been disclosed herein represents an embodiment of the invention and is to be construed as illustrative rather than restrictive in nature and that the invention is best described by the following claims:

1. An oscillating circuit comprising an oscillator having an output circuit, the output circuit is connected to the base of a drive transistor which has its collector connected to the base of a first transistor whose collector is connected to a load and to the base of the drive transistor through other electrical elements, the output circuit is further connected to the base of a second transistor, the collector of which is connected to the base of the drive transistor, and the emitters of the second transistor and the drive transistor are connected to negative potential.

2. An oscillating circuit as set forth in claim 1 wherein the collector of the first transistor is connected to the base of the drive transistor through a diode.

3. An oscillating circuit as set forth in claim 1 wherein the oscillator is an astable multivibrator.

* * * * *

UNITED STATES PATENT OFFICE
CERTIFICATE OF CORRECTION

Patent No. 3,631,359 Dated December 28, 1971

Inventor(s) Raymond A. Jones

It is certified that error appears in the above-identified patent and that said Letters Patent are hereby corrected as shown below:

In the claims, Claim 1, line 2, after "connected" insert -- through a coupling capacitor and a current limiting resistor --.

Signed and sealed this 16th day of May 1972.

(SEAL)
Attest:

EDWARD M.FLETCHER,JR.
Attesting Officer

ROBERT GOTTSCHALK
Commissioner of Patents